(12) United States Patent
Yoo

(10) Patent No.: US 7,102,187 B2
(45) Date of Patent: Sep. 5, 2006

(54) GATE STRUCTURE OF A SEMICONDUCTOR DEVICE

(75) Inventor: Min Soo Yoo, Icheon-Si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/174,788

(22) Filed: Jul. 5, 2005

(65) Prior Publication Data

US 2006/0145200 A1    Jul. 6, 2006

(30) Foreign Application Priority Data

Dec. 30, 2004    (KR) .................. 10-2004-0117299

(51) Int. Cl.
| | |
|---|---|
| H01L 27/108 | (2006.01) |
| H01L 29/76 | (2006.01) |
| H01L 29/94 | (2006.01) |
| H01L 31/119 | (2006.01) |

(52) U.S. Cl. ........................ 257/296; 257/354
(58) Field of Classification Search ............... 257/296, 257/297, 334, 349, 354
See application file for complete search history.

(56) References Cited

U.S. PATENT DOCUMENTS 6,274,913 B1    8/2001    Brigham et al.
6,670,253 B1    12/2003    Lee

FOREIGN PATENT DOCUMENTS

JP        403053534 A    *    3/1991

* cited by examiner

*Primary Examiner*—Hoai Pham
(74) *Attorney, Agent, or Firm*—Marshall, Gerstein & Borun LLP

(57) ABSTRACT

Disclosed herein is a method for forming a gate structure in a semiconductor device. The method comprises forming a SiGe film on a predetermined region of a silicon substrate corresponding to a bit-line node portion where a bit-line junction is formed, growing a silicon film over the silicon substrate having the SiGe film formed thereon, selectively etching the SiGe film, embedding a dielectric material into a portion where the SiGe film is removed, forming a stepped profile on the silicon film by etching a predetermined portion of the silicon film such that the bit-line node portion is included in the stepped profile, and forming a gate on the silicon film having the stepped profile formed therein such that the gate overlaps the stepped profile. The dielectric pad prevents the bit-line junction from spreading downward upon operation of the gate, thereby enhancing a punch-through phenomenon.

4 Claims, 4 Drawing Sheets

GATE STRUCTURE OF A SEMICONDUCTOR DEVICE

BACKGROUND OF THE INVENTION

1. Field of the Invention

The present invention generally relates to a gate in a semiconductor device and a method for forming the same. More particularly, the present invention relates to a gate in a semiconductor device, which prevents a punch-through phenomenon without a C-halo pocket structure, and a method for forming the same.

2. Description of the Related Art

As well known in the art, as the size of devices is reduced by technology of forming a high integration DRAM of a small gate pitch, the short channel margin is likely to be deteriorated. In order to solve the problem, three-dimensional type transistors have been developed, one being a step gate asymmetry recess cell (which is referred to as "STAR cell").

Generally, the STAR cell has a gate structure in which a vertical step is formed in a silicon substrate below a gate to increase the effective channel length, thereby enhancing the short channel margin. More specifically, as shown in FIG. 1, the STAR cell has a bit-line junction A located higher than a storage node junction B, thereby increasing the effective channel length X.

However, although the STAR cell has an increased effective channel length, a spacing X1 between the bit-line junction A and the storage node junction B is not changed in a deep region of the silicon substrate, and thus the STAR cell suffers from a punch-through phenomenon in the deep region of the silicon substrate.

In order to solve this problem, a C-halo pocket structure has been suggested, which can prevent the bit-line junction A and the storage node junction B from spreading to each other in a horizontal direction without affecting the doping concentration of a channel region determining the threshold voltage.

As shown in FIG. 2, in the C-halo structure, a diffusion region Y having a higher impurity concentration than that of a surrounding well region is formed by implanting impurity ions having opposite polarities into a portion near the bit-line junction A and the storage node junction B, thereby preventing the bit-line junction A and the storage node junction B from spreading to each other in a horizontal direction.

However, the gate of the C-halo pocket structure has a problem in that leakage current is increased due to damage of the gate during implantation of the impurity ions.

Accordingly, it is necessary to provide a method for forming a STAR cell which can solve the problem of punch-through without using the C-halo pocket structure.

SUMMARY OF THE INVENTION

A method for forming a gate in a semiconductor device provides a dielectric pad formed below a bit-line junction so as to prevent the bit-line junction from spreading downward, thereby enhancing a punch-through phenomenon.

Additionally, a method for forming a gate structure in a semiconductor device may include forming a SiGe film having a predetermined width on a silicon substrate; growing a silicon film having the same crystal direction as that of the silicon substrate over the silicon substrate having the SiGe film formed thereon; selectively etching the silicon film grown over the silicon substrate to remove the SiGe film; forming a dielectric pad at a portion where the SiGe film is removed, by oxidizing a portion of the silicon film from which the SiGe film is removed; forming a stepped profile comprising an upper surface, slant surfaces and a lower surface on the silicon film by etching the silicon film having the dielectric pad formed therein, the stepped profile having a step formed between the upper and lower surfaces thereof; and forming a gate on the silicon film having a stepped profile formed therein.

The dielectric pad may comprise $SiO_2$ formed by oxidation of the silicon film.

The dielectric pad may be located below a region where a bit-line junction is formed on the silicon film.

The gate may be formed on the silicon film comprising the entire upper surface, the slant surfaces, and the lower surface of the stepped profile.

BRIEF DESCRIPTION OF THE DRAWINGS

The foregoing features of the present invention will be more clearly understood from the following detailed description taken in conjunction with the accompanying drawings, in which.

DESCRIPTION OF THE PREFERRED EMBODIMENTS

Figure 1:
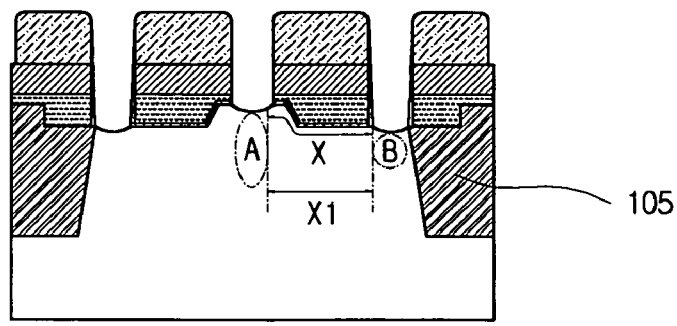
FIG. 1 is a diagram illustrating a gate having a STAR cell structure formed using conventional technology.
Figure 2:
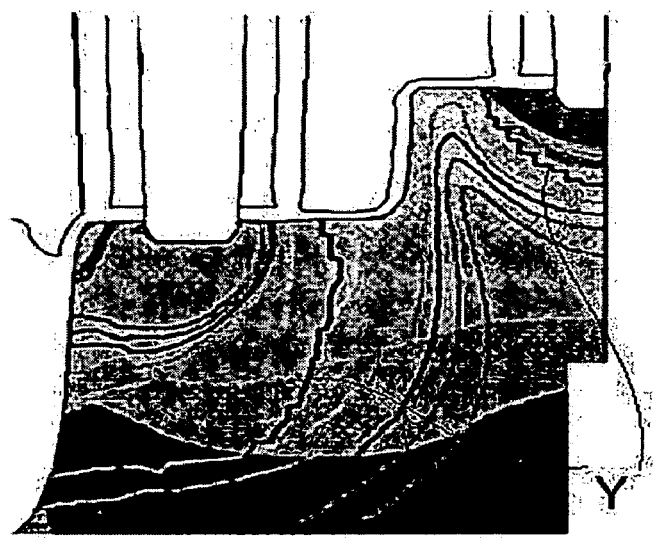
FIG. 2 is a diagram illustrating the STAR cell in which impurity ions are implanted to form a halo pocket structure in order to prevent a punch-through phenomenon.

Reference will now be made in detail to the embodiments of the present invention with reference to the accompanying drawings, in which like components are indicated by like reference numerals.

FIGS. 3a to 3d are step diagrams of a method for forming a dielectric sheet in a silicon substrate according to a preferred embodiment of the present invention.

Figure 3A:
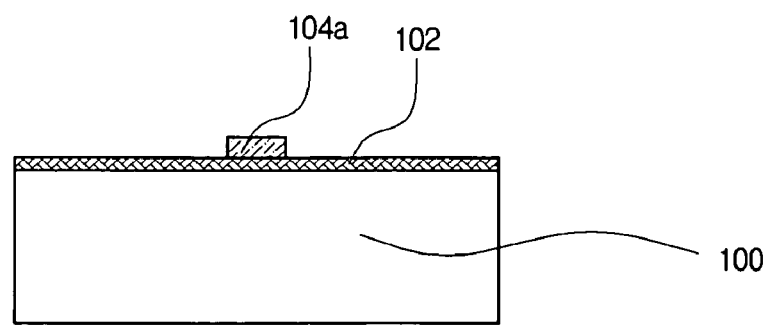
FIGS. 3a to 3d are step diagrams of a method for forming a dielectric pad in a silicon substrate according to a preferred embodiment of the present invention.

First, as shown in FIG. 3a, a SiGe film 102 is formed on a silicon substrate 100, and a first photosensitive film pattern 104 is formed on the SiGe film 102.

Figure 3B:
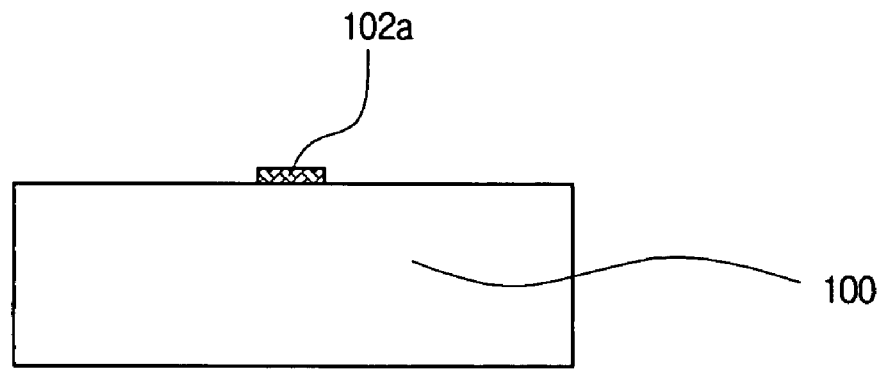

Next, as shown in FIG. 3b, the SiGe film 102 is etched through the first photosensitive film pattern 104 acting as a mask to form a SiGe film 102a having a predetermined width on the silicon substrate 100.

Figure 3C:
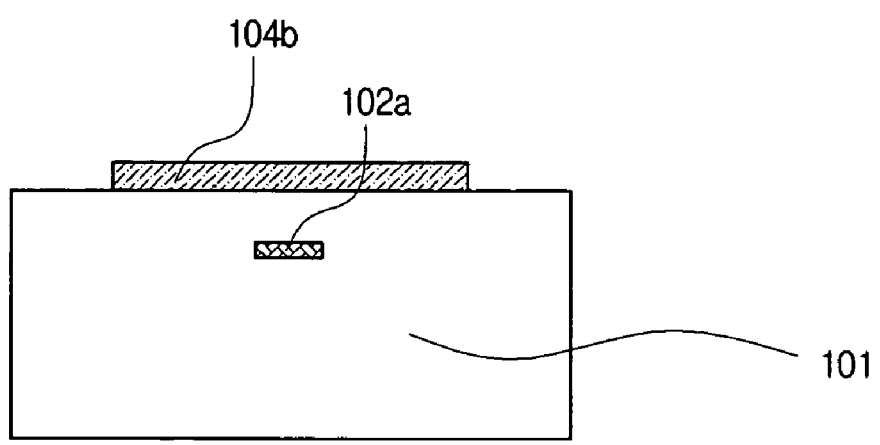

Next, as shown in FIG. 3c, a silicon film having the same crystal direction as that of the silicon substrate 100 is grown over the entirety of the silicon substrate 100 with the SiGe film 102a formed thereon to form a silicon substrate 101 by epitaxial growth, such that the SiGe film 102a is located within the silicon substrate 101. Then, a second photosensitive film pattern 104b for forming diode separating films is formed on the grown silicon substrate 101.

Figure 3D:
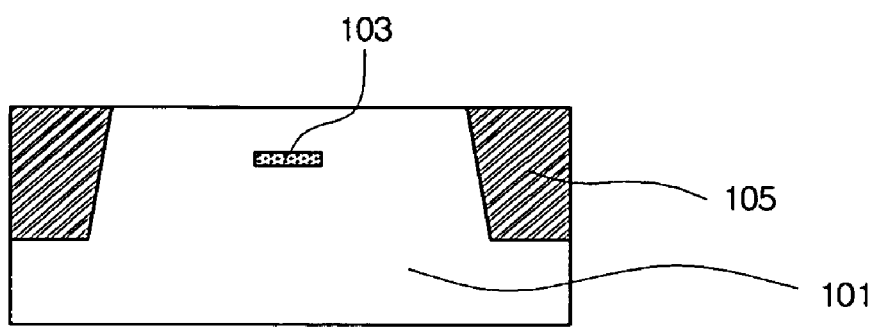

Next, as shown in FIG. 3d, after forming trenches by etching the silicon substrate 101 through the second photosensitive film pattern 104b acting as a mask, diode separating films 105 are formed by depositing an HDP oxidation film in the trenches, thereby defining active regions where gates will be formed.

Then, the SiGe film 102a is removed from inside of the silicon substrate 101 by selectively etching the silicon substrate 101 in which the diode separating films 105 are formed. This process is performed under dry or wet etching conditions wherein etching is selectively performed only to a portion comprising a germanium-based compound, that is, the SiGe film 102a, without affecting a portion comprising a silicon-based compound, such as the silicon substrate 101. By the etching process under such a condition, only the SiGe film 102a is selectively etched and removed without damaging the silicon substrate 101.

Meanwhile, since detailed conditions and method for selective etching are well known to those skilled in the art, detailed description thereof will be omitted hereinafter.

As a next step, a dielectric pad 103 is formed in a region from which the SiGe film is removed, by oxidizing the silicon substrate 101. Here, the dielectric pad 103 comprises silicon dioxide $SiO_2$ which is formed by oxidation of the silicon substrate 101, and is produced when silicon dioxide $SiO_2$ expands in volume and fills the internal region of the silicon substrate 101 from which the SiGe film is removed.

Then, a bit-line junction is formed on the silicon substrate 101 above the dielectric pad 103, which acts to prevent the bit-line junction from spreading downward upon operation of the gates, thereby preventing a punch-through phenomenon. As a result, it is not necessary for a STAR cell structure having the dielectric pad 103 to have the C-halo pocket structure in order to prevent the punch-through phenomenon.

FIGS. 3e to 3h are step diagrams of a method for forming the STAR cell structure using the dielectric pad on the silicon substrate according to a preferred embodiment of the invention.

Figure 3E:
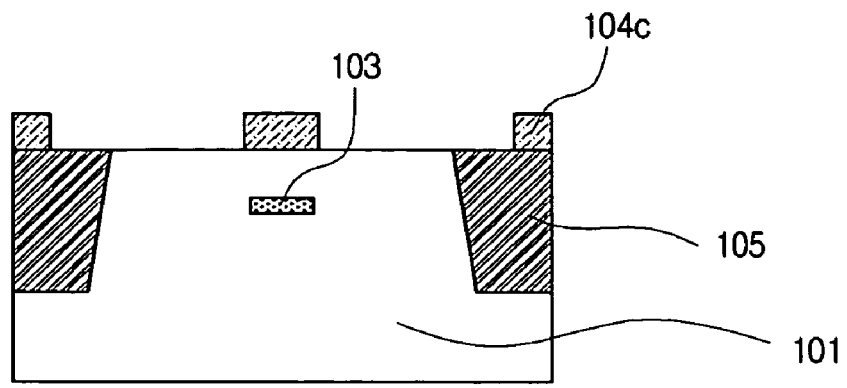
FIGS. 3e to 3h are step diagrams of a method for forming a gate of a STAR cell structure according to a preferred embodiment of the present invention.

First, as shown in FIG. 3e, a third photosensitive film pattern 104c is formed on the silicon substrate 101 having the dielectric pad 103 formed therein.

Figure 3F:
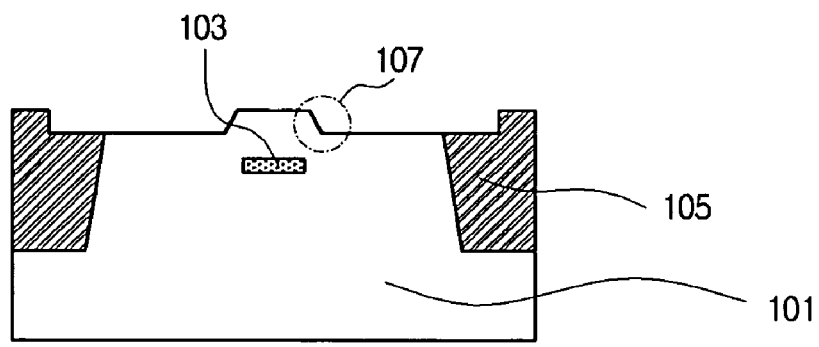

Then, as shown in FIG. 3f, a stepped profile having a vertical step is formed by etching the silicon substrate 101 through the third photosensitive film pattern 104c acting as a mask. The stepped profile comprises an upper surface, slant surfaces, and a lower surface, in which the vertical step is formed between the upper and lower surfaces, thereby increasing the length of a gate channel formed on the profile.

Figure 3G:
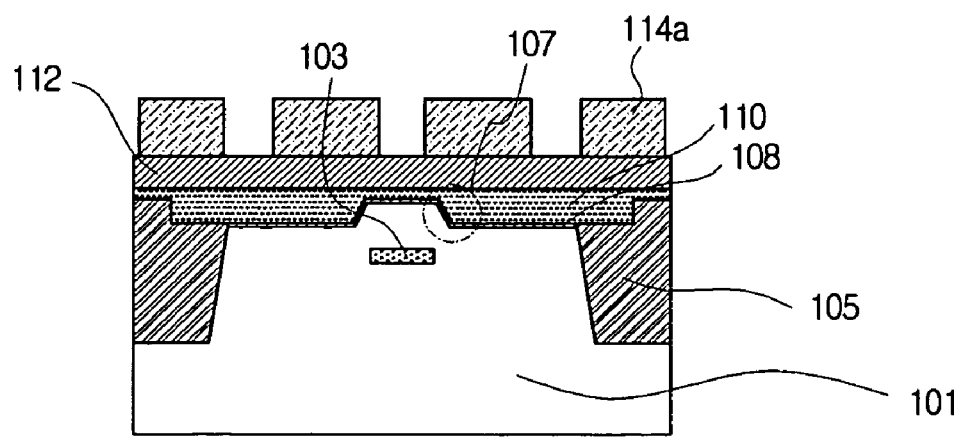

Next, as shown in FIG. 3g, a gate oxide film 108, a gate conductive film 110 and a gate silicide film 112 are sequentially stacked over the silicon substrate 101 on which the stepped profile is formed, and a hard-mask nitride film pattern 114a for defining a plurality of gate-forming regions is formed on the gate silicide film 112.

Figure 3H:
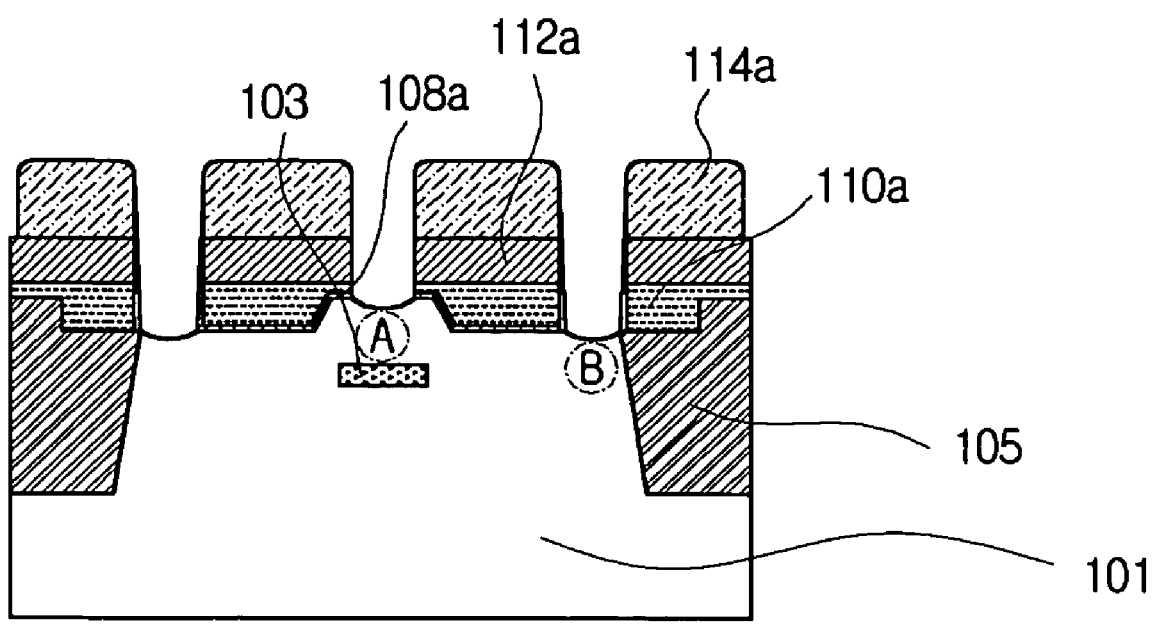

Next, as shown in FIG. 3h, the gate oxide film 108, the gate conductive film 110, and the gate silicide film 112 are sequentially etched through the hard-mask nitride film pattern 114a acting as a mask to form a plurality of gates consisting of a gate oxide film 108a, a gate conductive film 110a, and a gate silicide film 112a.

Finally, a bit-line junction A and a storage node junction B are formed below portions of the silicon substrate exposed between the gates. Here, the dielectric pad 103 of the embodiment is formed below the bit-line junction A, and prevents the bit-line junction from spreading downward upon operation of the gates.

As a result, since the presence of the bit-line junction is limited to a predetermined depth of the silicon substrate having the stepped profile formed thereon, the present invention can solve the problem of punch-through phenomenon caused by a reduced horizontal distance between the bit-line junction and the node junction in a deep region of the silicon substrate.

Meanwhile, it should be noted that the present invention is not limited to the STAR cell structure of the embodiment as described above. That is, the present invention can be applied not only to a STAR cell structure wherein the STAR cell is formed on the silicon substrate having a profile with different types of step from the stepped profile, but also to an under STAR cell structure wherein trenches are formed in the silicon substrate to have a vertical step formed at a lower portion thereof, and a gate is formed in each of the trenches. This is attributed to the fact that the method for preventing the punch-through phenomenon by inserting the dielectric pad for preventing downward spread of the bit-line junction, it can be applied to any STAR cell structure having a vertical step formed between the bit-line junction and the node junction.

As apparent from the above description, according to preferred embodiments of the invention, the dielectric pad may be formed below the bit-line junction, and thereby prevent the bit-line junction from spreading downward upon operation of the gates, thereby enhancing the punch-through phenomenon.

Additionally, the C-halo pocket structure is not required, thereby preventing current leakage.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A gate structure in a semiconductor device, comprising:
   a dielectric pad formed above a predetermined region of a silicon substrate and only in a portion corresponding to a bit-line node portion where a bit-line junction is formed;
   a silicon film formed over the entire silicon substrate so as to embed the dielectric pad therein;
   a gate formed on the silicon film; and
   a stepped profile comprising an upper surface, slant surfaces and a lower surface, and formed on the silicon film such that the bit-line node portion is included in the stepped profile,
   wherein the gate is formed on the silicon film such that the gate overlaps the stepped profile.

2. The gate structure according to claim 1, wherein the silicon film has the same crystal direction as that of the silicon substrate.

3. The gate structure according to claim 1, wherein, the dielectric pad comprises a silicon oxide film.

4. The gate structure according to claim 1, wherein the gate has a structure in which a gate dielectric film, a gate conductive film, a gate silicide film, and a hard-mask film are sequentially stacked.

* * * * *